US010177046B2

(12) United States Patent
Cheng et al.

(10) Patent No.: US 10,177,046 B2
(45) Date of Patent: Jan. 8, 2019

(54) VERTICAL FET WITH DIFFERENT CHANNEL ORIENTATIONS FOR NFET AND PFET

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/436,013

(22) Filed: Feb. 17, 2017

(65) Prior Publication Data
US 2018/0240716 A1    Aug. 23, 2018

(51) Int. Cl.
*H01L 21/8238* (2006.01)
*H01L 27/092* (2006.01)
(Continued)

(52) U.S. Cl.
CPC ........ *H01L 21/823892* (2013.01); *H01L 21/823807* (2013.01); *H01L 21/823878* (2013.01);
(Continued)

(58) Field of Classification Search
CPC ....... H01L 21/823487; H01L 29/66666; H01L 29/66712–29/66734; H01L 29/7802–29/7815; H01L 29/7827–29/7828; H01L 29/78642; H01L 51/057; H01L 2924/13067; H01L 29/41791; H01L 29/7855–29/7856;
(Continued)

(56) References Cited

U.S. PATENT DOCUMENTS

| 7,432,149 B2 | 10/2008 | Wu et al. |
|---|---|---|
| 7,485,506 B2 | 2/2009 | Doris et al. |

(Continued)

OTHER PUBLICATIONS

M. Yang et al., "Performance Dependence of CMOS on Silicon Substrate Orientation for Ultrathin Oxynitride and HfO2 Gate Dielectrics," IEEE Electron Device Letters, vol. 24, No. 5, May 2003, pp. 339-341.

*Primary Examiner* — Thanh Y Tran
(74) *Attorney, Agent, or Firm* — Cantor Colburn LLP; Vazken Alexanian

(57) ABSTRACT

A technique relates to forming a semiconductor device. A first substrate is provided adjacent to a second substrate. The first substrate has a first surface orientation, and the second substrate has a second surface orientation different from the first surface orientation. An n-type field effect transistor (NFET) device is formed with the first substrate. The NFET device includes a first source, a first drain, and one or more first fins. The first source and the first drain have a vertical relationship with respect to the one or more first fins. A p-type field effect transistor (PFET) device is formed with the second substrate. The PFET device includes a second source, a second drain, and one or more second fins. The second source and the second drain have a vertical relationship with respect to the one or more second fins.

19 Claims, 21 Drawing Sheets

(51) Int. Cl.
    *H01L 29/04* (2006.01)
    *H01L 29/78* (2006.01)
(52) U.S. Cl.
    CPC .. *H01L 21/823885* (2013.01); *H01L 27/0928* (2013.01); *H01L 29/045* (2013.01); *H01L 29/7827* (2013.01)
(58) Field of Classification Search
    CPC ....... H01L 29/66795; H01L 21/823431; H01L 21/823878; H01L 21/823885; H01L 27/0928
    See application file for complete search history.

(56) References Cited

U.S. PATENT DOCUMENTS

| | | | |
|---|---|---|---|
| 7,569,857 B2 | 8/2009 | Tolchinsky et al. | |
| 7,892,956 B2 | 2/2011 | Deligianni et al. | |
| 9,601,491 B1* | 3/2017 | Mallela | H01L 27/0924 |
| 9,653,602 B1* | 5/2017 | Cheng | H01L 29/7845 |
| 2014/0217467 A1* | 8/2014 | Pawlak | H01L 29/12 257/183 |
| 2015/0014789 A1 | 1/2015 | Xiong et al. | |
| 2015/0303202 A1* | 10/2015 | Sun | H01L 21/823487 257/392 |
| 2016/0163810 A1* | 6/2016 | Huang | H01L 29/42392 257/329 |
| 2017/0076993 A1* | 3/2017 | Basker | H01L 21/823821 |
| 2017/0154821 A1* | 6/2017 | Cheng | H01L 21/823431 |
| 2017/0222021 A1* | 8/2017 | Mallela | H01L 29/66553 |
| 2018/0005899 A1* | 1/2018 | Cheng | H01L 21/823481 |

* cited by examiner

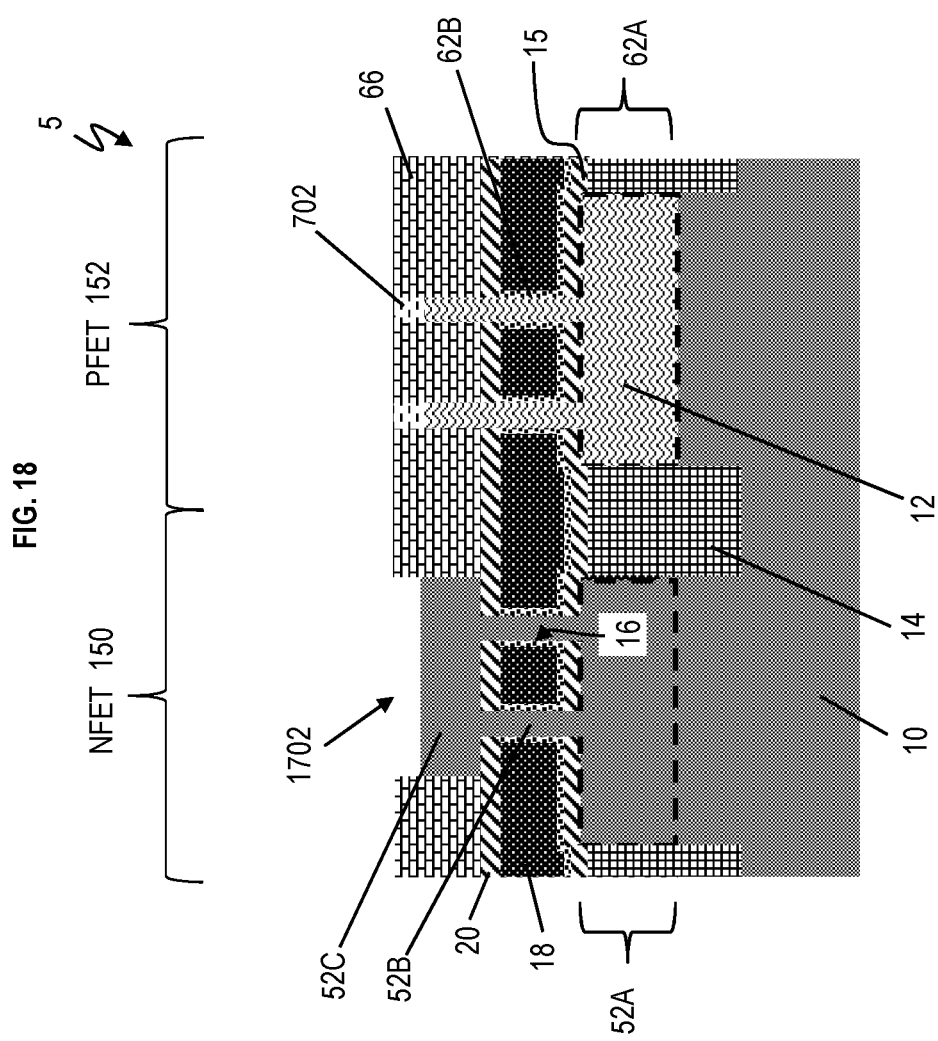

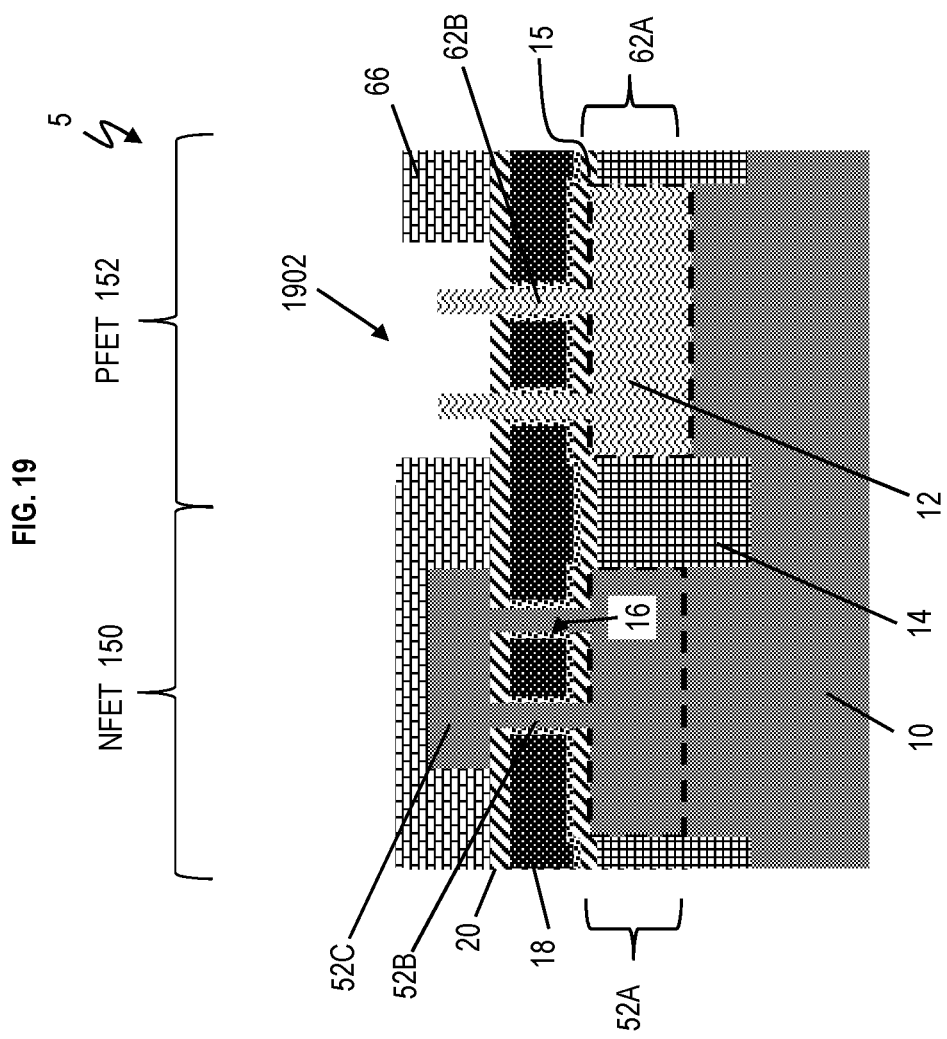

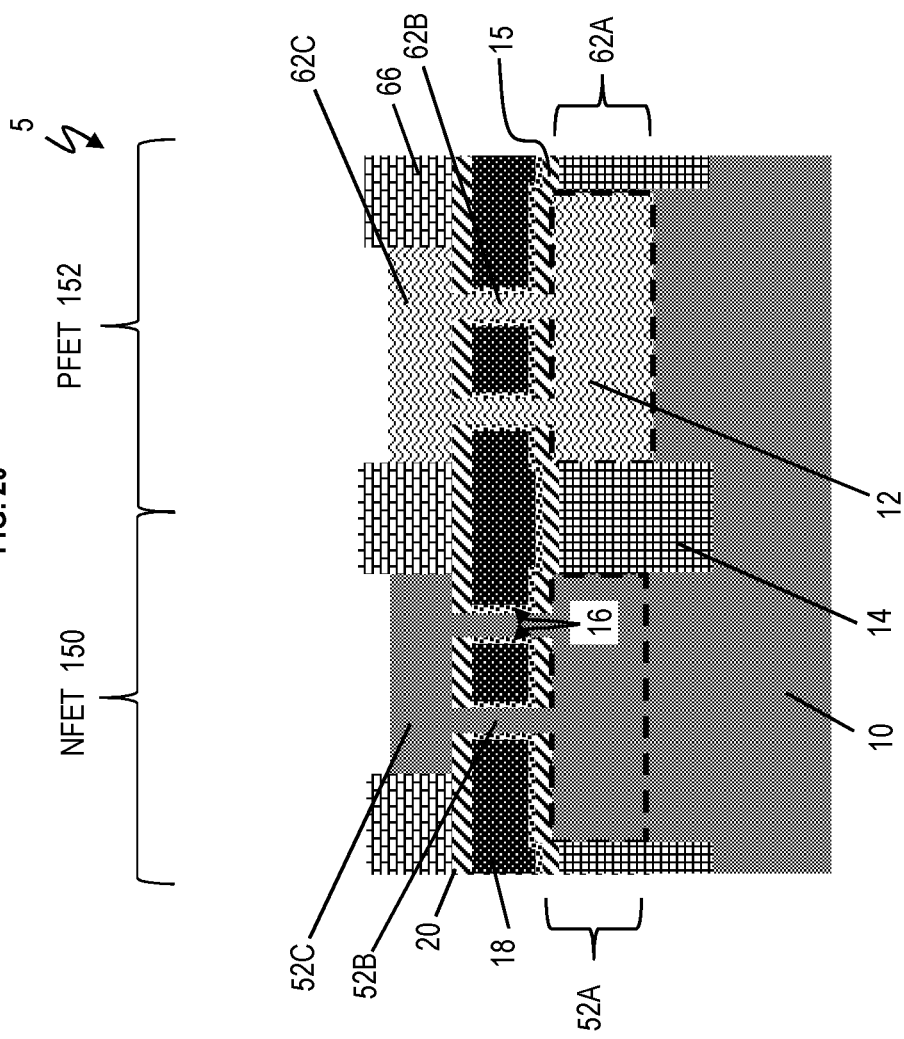

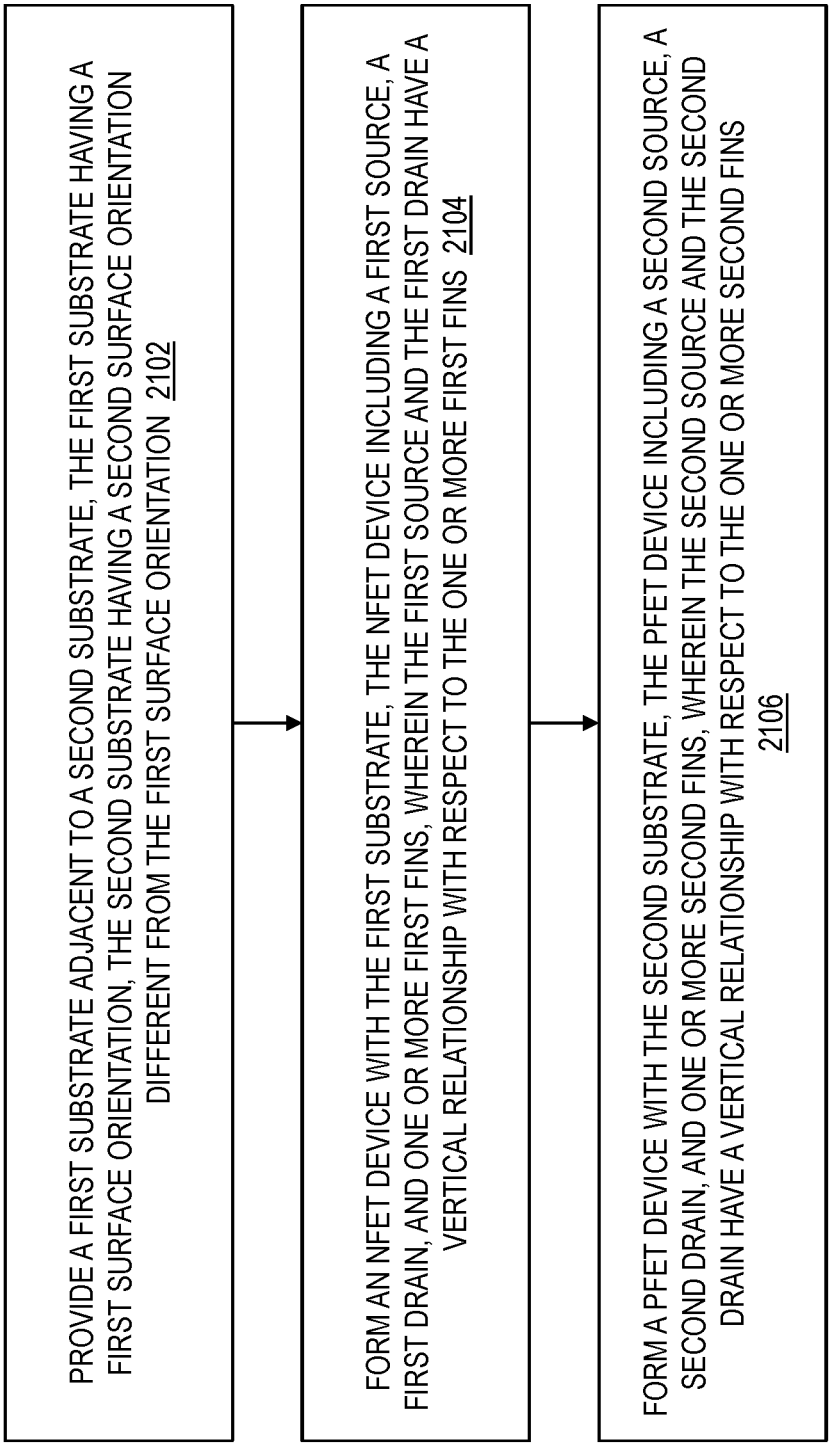

VERTICAL FET WITH DIFFERENT CHANNEL ORIENTATIONS FOR NFET AND PFET

BACKGROUND

The present invention relates in general to vertical field effect transistor (VFETs), and more specifically, to fabrication methodologies and resulting structures for providing different channel orientations for n-type VFETs and p-type VFETs.

A field effect transistor (FET) is a semiconductor device in which output current, i.e., source-drain current, is controlled by the voltage applied to a gate structure of the semiconductor device. An FET has three terminals, namely, a gate structure, a source region and a drain region. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of the semiconductor device that becomes conductive when the semiconductor device is turned on.

SUMMARY

According to one or more embodiments, a method of forming a semiconductor device is provided. The method includes providing a first substrate adjacent to a second substrate. The first substrate has a first surface orientation, and the second substrate has a second surface orientation different from the first surface orientation. The method includes forming an n-type field effect transistor (NFET) device with the first substrate. The NFET device includes a first source, a first drain, and one or more first fins. The first source and the first drain have a vertical relationship with respect to the one or more first fins. Also, the method includes forming a p-type field effect transistor (PFET) device with the second substrate, the PFET device including a second source, a second drain, and one or more second fins. The second source and the second drain have a vertical relationship with respect to the one or more second fins.

According to one or more embodiments, a semiconductor device is provided. A first substrate is adjacent to a second substrate. The first substrate has a first surface orientation. The second substrate has a second surface orientation different from the first surface orientation. An n-type field effect transistor (NFET) device is formed with the first substrate. The NFET device includes a first source, a first drain, and one or more first fins. The first source and the first drain have a vertical relationship with respect to the one or more first fins. A p-type field effect transistor (PFET) device is formed with the second substrate. The PFET device includes a second source, a second drain, and one or more second fins. The second source and the second drain have a vertical relationship with respect to the one or more second fins.

According to one or more embodiments, a method of forming a semiconductor device is provided. The method includes forming an n-type field effect transistor (NFET) device. The NFET device includes a first source, a first drain, a gate metal, a gate dielectric, and one or more first fins. The first source and the first drain have a vertical relationship with respect to the one or more first fins. The first source, the first drain, and the one or more first fins have a first surface orientation. The method includes forming a p-type field effect transistor (PFET) device. The PFET device includes a second source, a second drain, the gate metal, the gate dielectric, and one or more second fins. The second source and the second drain have a vertical relationship with respect to the one or more second fins. The second source, the second drain, and the one or more second fins have a second surface orientation different from the first surface orientation.

BRIEF DESCRIPTION OF THE DRAWINGS

FIG. 18 is a cross-sectional view of the VFET structure depicting formation of the top source/drain of the NFET device according to one or more embodiments.

FIG. 19 is a cross-sectional view of the VFET structure depicting exposure of fins according to one or more embodiments.

FIG. 20 is a cross-sectional view of the VFET structure depicting formation of the top source/drain of the PFET device according to one or more embodiments.

FIG. 21 is a flow chart of a method of forming a vertical device according to one or more embodiments.

DETAILED DESCRIPTION

Figure 1:
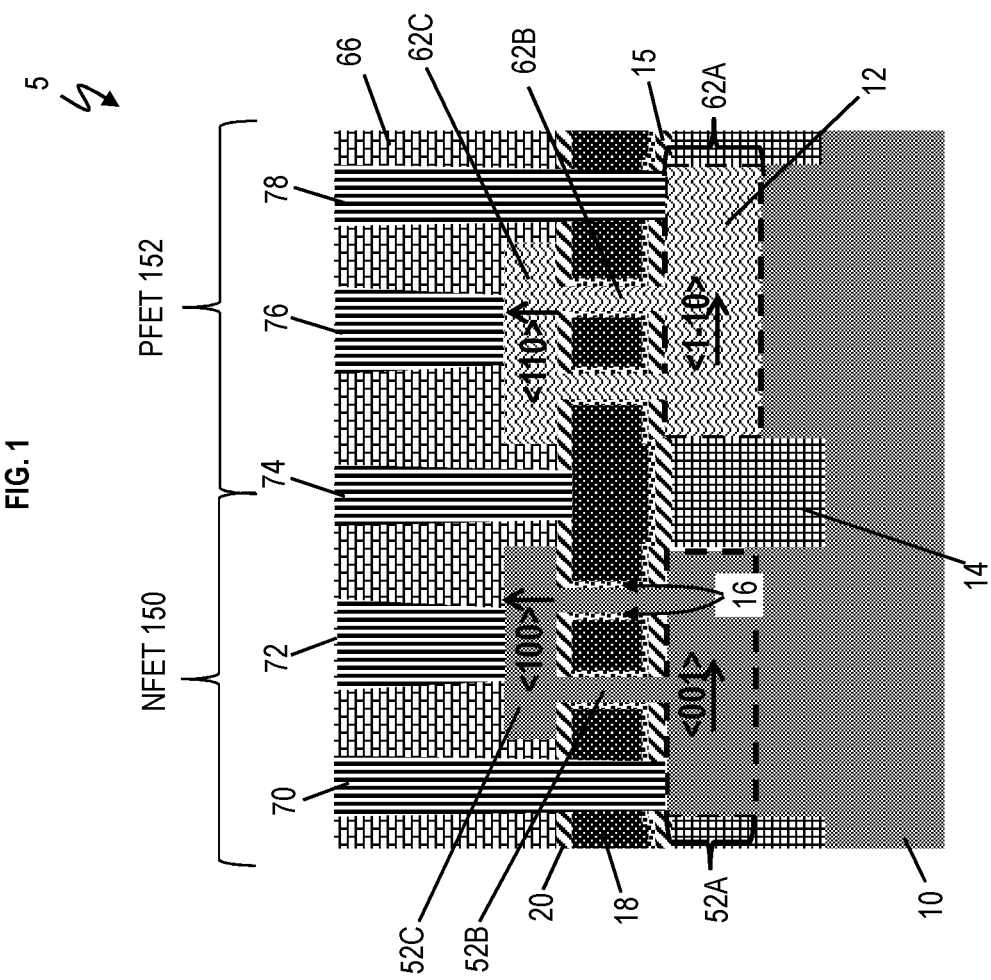
FIG. 1 is a cross-sectional view of a VFET structure according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In some embodiments, the methods and structures described herein are related to forming semiconductor devices including semiconductor materials. Example semiconductor materials can include III-V semiconductor materials. As used herein, the term "semiconductor device" can refer to an intrinsic semiconductor material that has been doped, which means that a doping agent has been introduced thus giving the semiconductor device different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. For example, when the dominant carrier concentration is electrons, the semiconductor device is referred to as being an n-type semiconductor device. When the dominant carrier concentration is holes, the semiconductor device is referred to as being a p-type semiconductor device.

A type "III-V" semiconductor material denotes a semiconductor material that includes at least one element from Group IIIA (group 13 under the modem International Union of Pure and Applied Chemistry (IUPAC)) and at least one element from Group VA (group 15 under the modem International Union of Pure and Applied Chemistry (IUPAC)) of the Periodic Table of Elements. Typically, the III-V compound semiconductors are binary, ternary or quaternary alloys including IIIN elements.

Turning now to a description of technologies that are more specifically relevant to aspects of the present invention, in crystallography, a crystal structure is a description of the ordered arrangement of atoms, ions, or molecules in a crystalline material. Ordered structures occur from the intrinsic nature of the constituent particles to form symmetric patterns that repeat along the principal directions of three-dimensional space in matter. The surface orientation defines the crystal structure. Miller indices are a notation system in crystallography for planes in crystal (Bravais) lattices. In particular, a family of lattice planes is determined by three integers h, k, and l, which are the Miller indices, and they are written (hkl).

In semiconductor materials, carrier mobility is strongly dependent on channel surface orientation and transport direction. In an unstrained channel, {100} surface gives the highest mobility for electrons while {110} surfaces combined with <110> channel direction yield the highest mobility for holes. It very difficult to induce strain in VFETs because of the inherent vertical structure of the VFET, so known final VFET architectures use unstrained channels.

VFETs are a promising candidate for 5 nanometer (nm) technology and beyond. According to one or more embodiments of the present invention, VFETs are described with different channel orientations for n-type and p-type versions of the VFET devices. In order to maximize the current driving capability of VFET device architectures, VFETs fabricated according to embodiments of the present invention are configured to utilize the best possible surface orientation and channel orientation for n-type and p-type version devices.

Now turning to the figures, FIG. 1 is a cross-sectional view of a VFET structure 5 according to one or more embodiments of the present invention. The VFET structure 5 depicts both an NFET device 150 and PFET device 152 which have different channel surface orientations and different channel transport directions. The NFET 150 has a channel transport direction <100> and a channel surface orientation {001}. In the NFET device 150, the {001} surface orientation favors electron mobility.

The PFET 152 has a channel transport direction <110> and a channel surface orientation {1-10}. In the PFET device 152, the channel transport direction <110> is the direction that holes (i.e., which are the majority carrier in PFETs) travel between the source and drain (e.g., between source/drain 62A and source/drain 62C). The <110> orientation for the channel transport direction with {110} or {1-10} family surfaces provides the highest mobility for holes.

The VFET structure 5 is a semiconductor device. The VFET structure 5 includes a first semiconductor substrate 10 and a second semiconductor substrate 12. The first substrate 10 and the second substrate 12 can be two wafers. In one embodiment, one or both of the semiconductor substrates 10 and 12 can be a bulk semiconductor substrate. A "bulk semiconductor substrate" is a substrate that is composed of a single semiconductor material. The semiconductor material that provides the bulk semiconductor substrate can be a semiconducting material including, but not limited to silicon, strained silicon, a silicon carbon alloy (SiC), silicon germanium (SiGe), a silicon germanium and carbon alloy (SiGeC), silicon alloys, germanium, germanium alloys, gallium arsenic, indium arsenic, indium phosphide, as well as other III-V and II-VI compound semiconductors.

In some embodiments, the upper surface of the semiconductor substrate 10 and 12 are crystalline material, such as a single crystal material. The term "crystalline" includes nanocrystalline, polycrystalline or microcrystalline. The term "single crystalline" denotes a crystalline solid, in which the crystal lattice of the entire sample is substantially continuous and substantially unbroken to the edges of the sample, with substantially no grain boundaries.

The VFET structure 5 includes isolation regions 14 which are also referred to as shallow trench isolation regions. The isolation regions 14 can be composed of any dielectric, such as an oxide, nitride, and/or oxynitride material. For example, the isolation region 14 when composed of an oxide can be silicon oxide ($SiO_2$), and the isolation region 14 when composed of a nitride can be silicon nitride. In some embodiments, the isolation region 14 can be formed using photolithography, etch, and deposition processes.

The NFET device 150 has a source/drain 52A, vertical fins 52B, and source/drain 52C. The PFET device 152 has a source/drain 62A, vertical fins 62B, and source/drain 62C. A first spacer 15 is adjacent to the semiconductor substrate 10, the semiconductor substrate 12, and isolation regions 14. A high-k dielectric layer 16 is adjacent to the substrate 10, substrate 12, isolation regions 14, fins 52B, and fins 62B. A gate metal 18 is adjacent to the high-k dielectric layer 16, first spacer 15, and second spacer 20. An inter-level dielectric layer 66 is adjacent to the second spacer 20 source/drain 52C, source/drain 62C, and contacts 70, 72, 74, 76, and 78.

Figure 2:
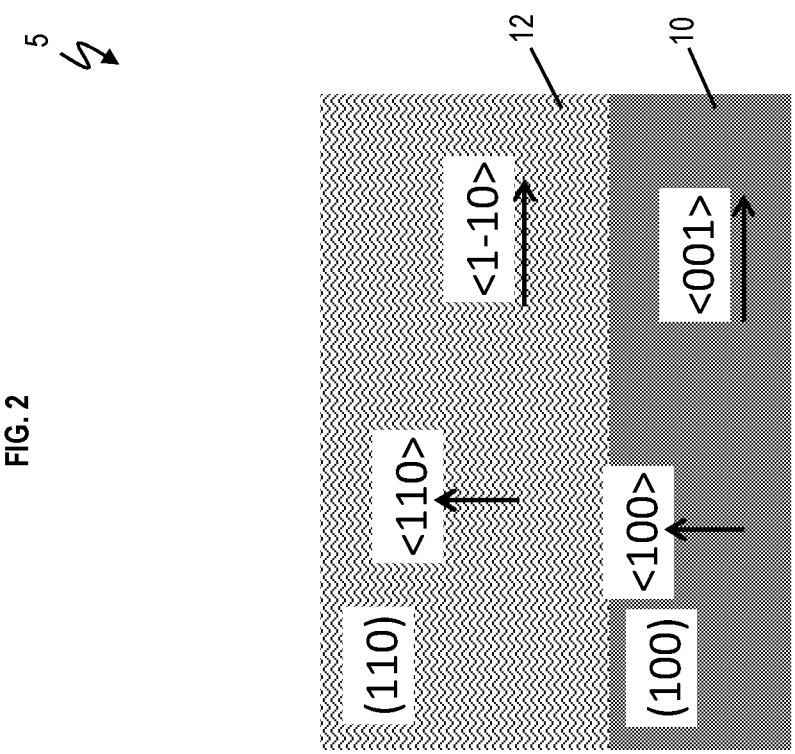
FIG. 2 is a cross-sectional view of the VFET structure depicting a (110) structure on top of a (100) structure (or vice versa) according to one or more embodiments.

FIGS. 2-20 illustrate an example process flow of fabricating the VFET structure 5 in FIG. 1. FIG. 2 is a cross-sectional view of the VFET structure 5 depicting a (110) semiconductor substrate 12 on top of a (100) semiconductor substrate 10 (or vice versa) according to one or more embodiments. The example shown in FIG. 2 has a (100) bottom substrate 10 and a (110) top substrate 12, which can be formed by, for example, a wafer bonding technique. In FIG. 2, the orientation of the semiconductor substrate 10 is designed such that the NFETs have (001) channel surface orientation and <100> channel transport direction. The orientation of the semiconductor substrate 12 is designed such that the PFETs have (1-10) surface orientation and <110> channel transport direction.

Figure 3:
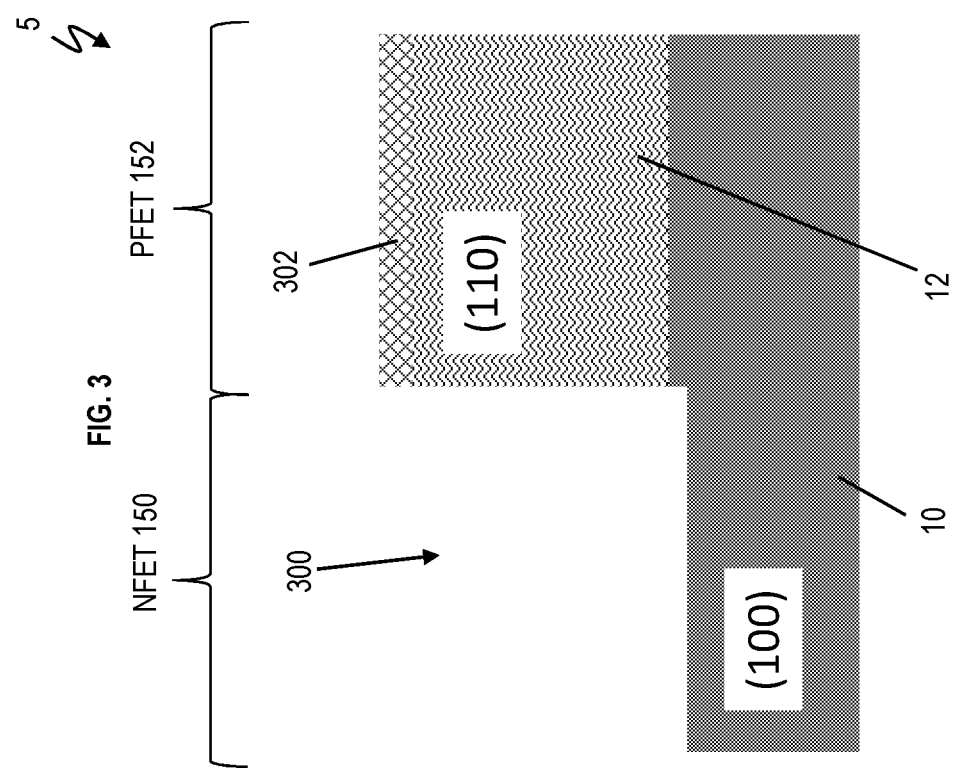
FIG. 3 is a cross-sectional view of the VFET structure depicting etching of the semiconductor substrate according to one or more embodiments.

FIG. 3 is a cross-sectional view of the VFET structure 5 depicting etching of the semiconductor substrate 10 according to one or more embodiments. In FIG. 3, a mask layer 302 is formed on the PFET side of the VFET structure 5 to protect a portion of the substrate 12. The mask layer 302 can be, for example, a SiNx hard mask. Etching is performed to remove part of the semiconductor substrates 10 and 12 thereby forming a via 300. For example, a reactive ion etch (RIE) can be performed to etch down the left side using the SiNx mask to protect the right side and the etching continues until the bottom substrate 10 is reached. In this example, the etching leaves the semiconductor substrate 10 on the right side (PFET side) higher than the semiconductor substrate 10 on the left side (NFET side), thereby ensuring that the bottom substrate 10 is reached. In other words, the height of the semiconductor substrate 10 on the side of the NFET device 150 is higher in the y-axis than the height of the semiconductor substrate 10 on the side of the PFET device 152 in FIG. 3. In another embodiment, the height of left and right sides of the semiconductor substrate 10 can be about the same.

Figure 4:
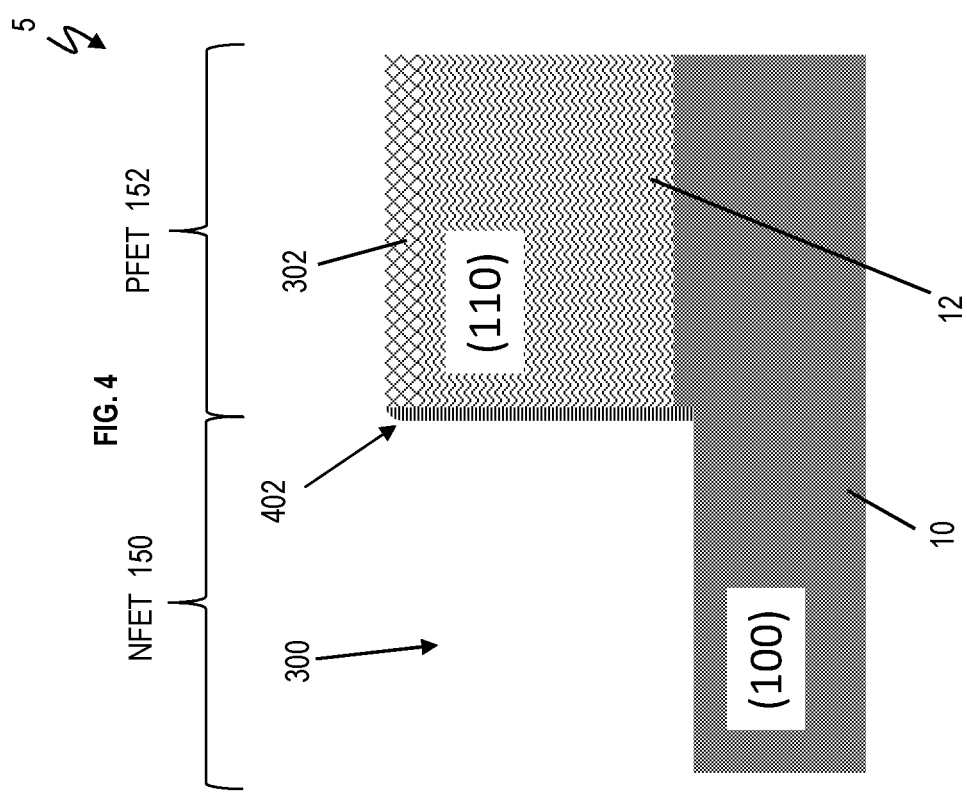
FIG. 4 is a cross-sectional view of the VFET structure depicting formation of a side wall spacer according to one or more embodiments.

FIG. 4 is a cross-sectional view of the VFET structure 5 depicting formation of a side wall spacer 402 according to one or more embodiments. The side wall spacer 402 is formed along the side of mask layer 302, the protected substrate 12, and a portion of the substrate 10. In an embodiment, the side wall spacer 402 can be a $SiO_2$ side wall spacer. The side wall spacer 402 can be formed by conformal deposition of the side wall material and followed by a directional etch back.

Figure 5:
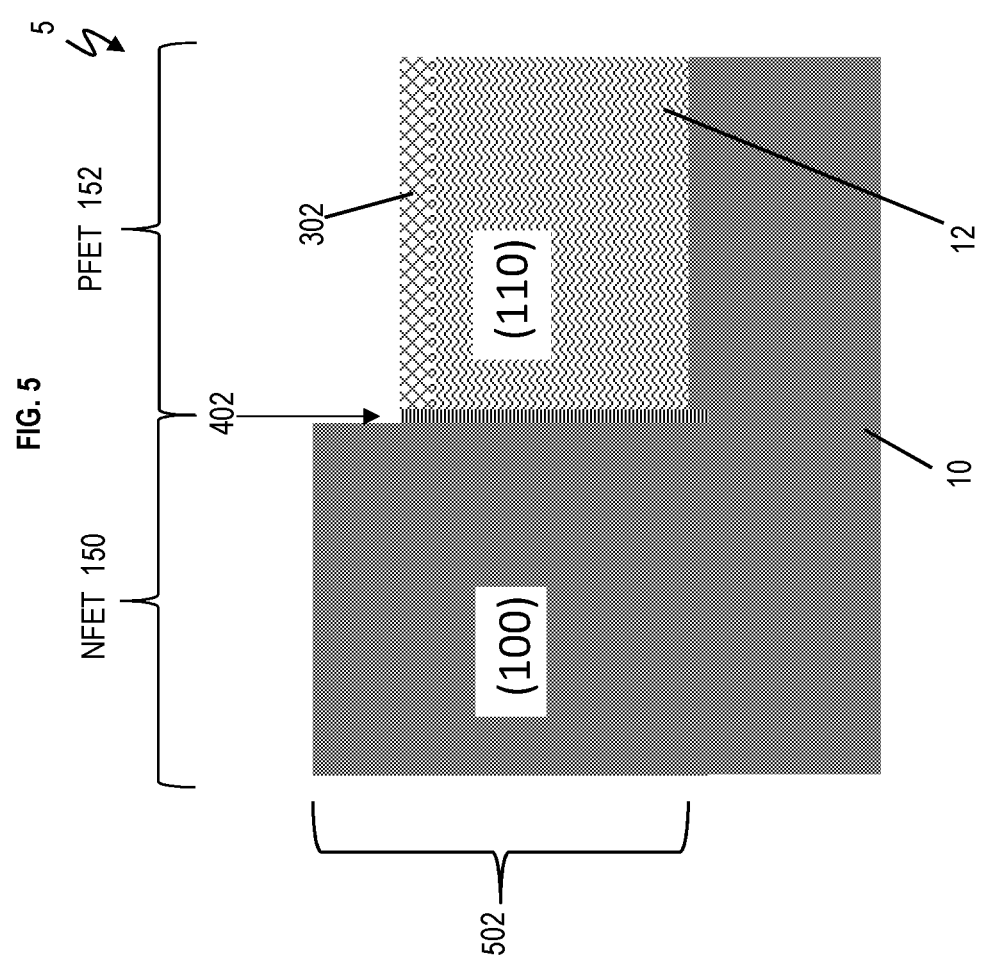
FIG. 5 is a cross-sectional view of the VFET structure depicting epitaxial growth of the semiconductor substrate according to one or more embodiments.

FIG. 5 is a cross-sectional view of the VFET structure 5 depicting epitaxial growth of the semiconductor substrate 10 according to one or more embodiments. An epitaxial layer 502 is epitaxially grown on exposed (100) surface of the semiconductor substrate 10 on the NFET 150. Accordingly, both the semiconductor substrate 10 and the epitaxial layer 502 have the same surface orientation (100). It should be appreciated that n-type dopants can be included during the epitaxial growth of the epitaxial layer 502 (also referred to as an epi layer). The semiconductor substrate 12 is protected by the mask layer 302 and the side wall spacer 402.

The terms "epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a <100> crystal surface will take on a <100> orientation.

The exposed upper surface of the semiconductor substrate 10 provides the seed surface for epitaxial growth of the semiconductor material of the epitaxial layer 502. More specifically, epitaxial growth of the semiconductor material of the epitaxial layer 502 starts at the exposed upper surface of the semiconductor substrate 10 filling the via 300 (shown in FIG. 3) as the deposition process continues, and once the via 300 is filled, the epitaxially grown epitaxial layer 502 grows from the via 300. As the epitaxially growth process continues, the semiconductor material can fill the via 300, where the epitaxial semiconductor material is in direct contact with the base surface (of the substrate 10) and the side wall spacer 402. In some embodiments, the epitaxial growth can continue after the via 300 is entirely filled and until a portion of the epitaxial semiconductor material of the epitaxial layer 502 extends from the via 300 as shown in FIG. 6.

Figure 6:
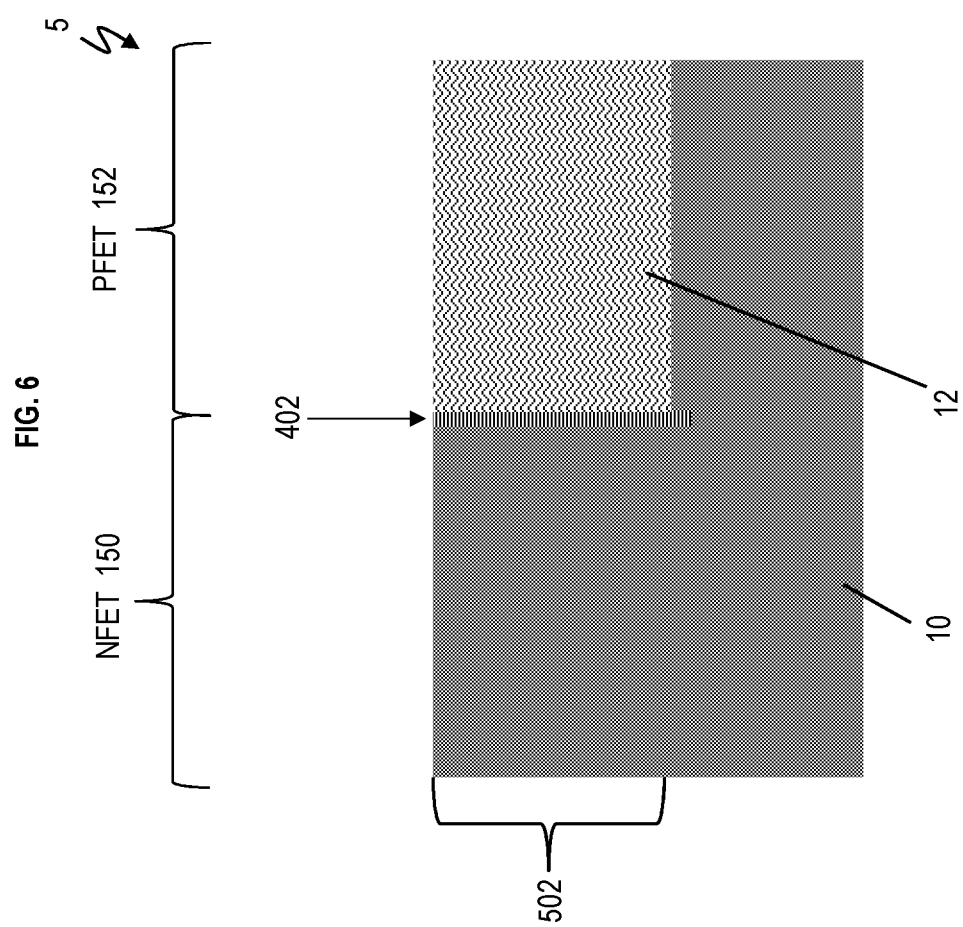
FIG. 6 is a cross-sectional view of the VFET structure depicting planarization according to one or more embodiments.

FIG. 6 is a cross-sectional view of the VFET structure 5 depicting planarization according to one or more embodiments. The top of the VFET structure 5 is planarized to remove the excess semiconductor material of the epitaxial layer 502. The semiconductor material of the epitaxial layer 502 can be removed by, for example, a suitable etching process, grinding, or chemical mechanical polishing (CMP). The upper surface of the VFET structure 5 can be planarized so that the upper surface of the epitaxial layer 502 is coplanar with the upper surface of the substrate 12. Also, the top surface of the VFET structure 5 can be cleaned.

Figure 7:
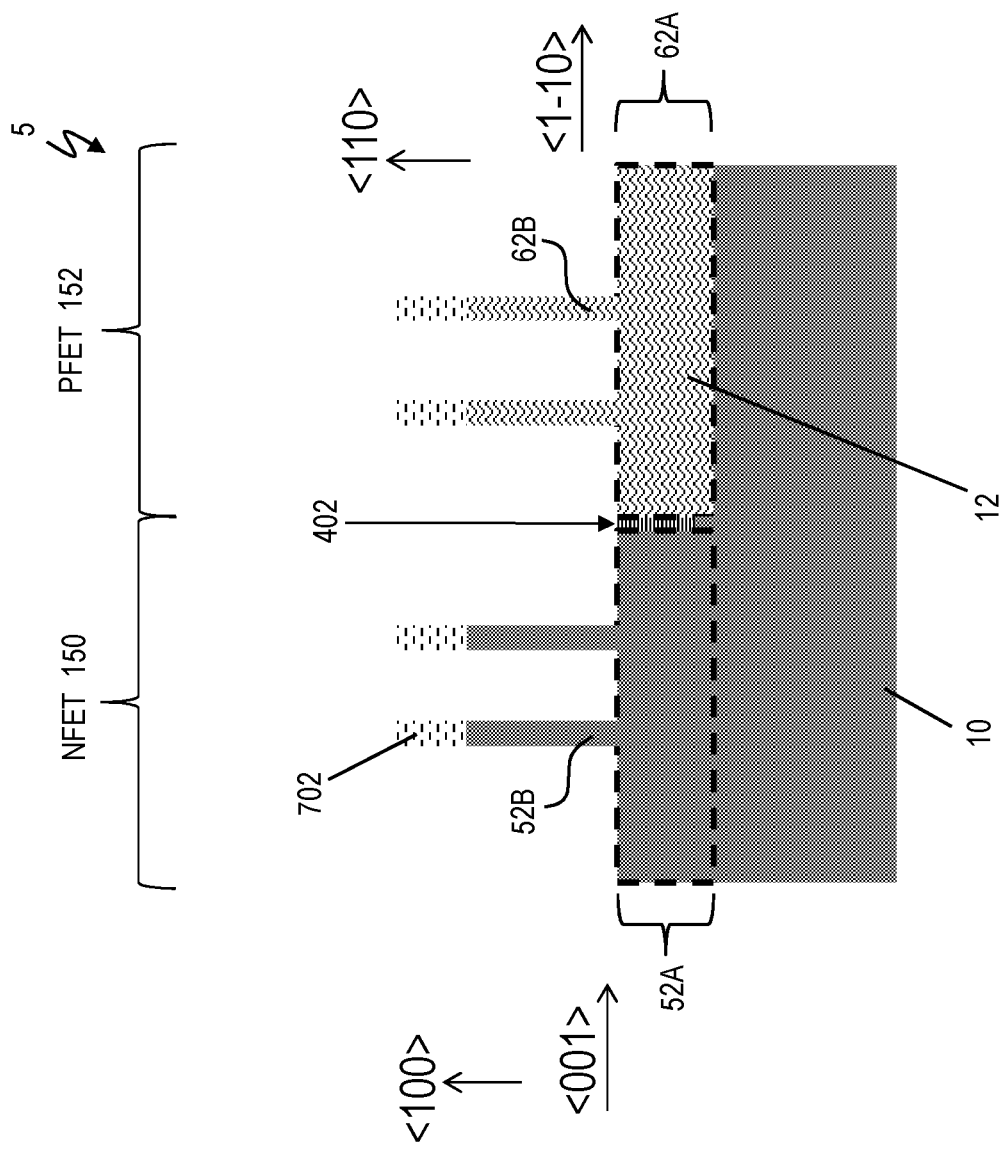
FIG. 7 is a cross-sectional view of the VFET structure depicting formation of the vertical fin channels according to one or more embodiments.

FIG. 7 is a cross-sectional view of the VFET structure 5 depicting formation of the vertical fin channels according to one or more embodiments. A fin mask layer 702 can be deposited on top of the VFET structure 5 and patterned on top of the epitaxial layer 502 and the semiconductor substrate 12. The fin mask layer 702 is a hard mask. The patterned fin mask layer 702 is in preparation of forming the fins 52B and fins 62B of the NFET device 150 and PFET device 152 respectively. With the fin mask layer 702 in place, etching is performed to form the vertical fins 52B in the epitaxial layer 502 of the NFET device 150 and form the vertical fins 62B in the semiconductor substrate 12 of the PFET device 152. The etching results in formation of the source/drain 52A of the NFET device 150 and the source/drain 62A of the PFET device 152. During the vertical fin formation, the side wall spacer 402 is also recessed along with the epitaxial layer 502 and the semiconductor substrate 12.

Figure 8:
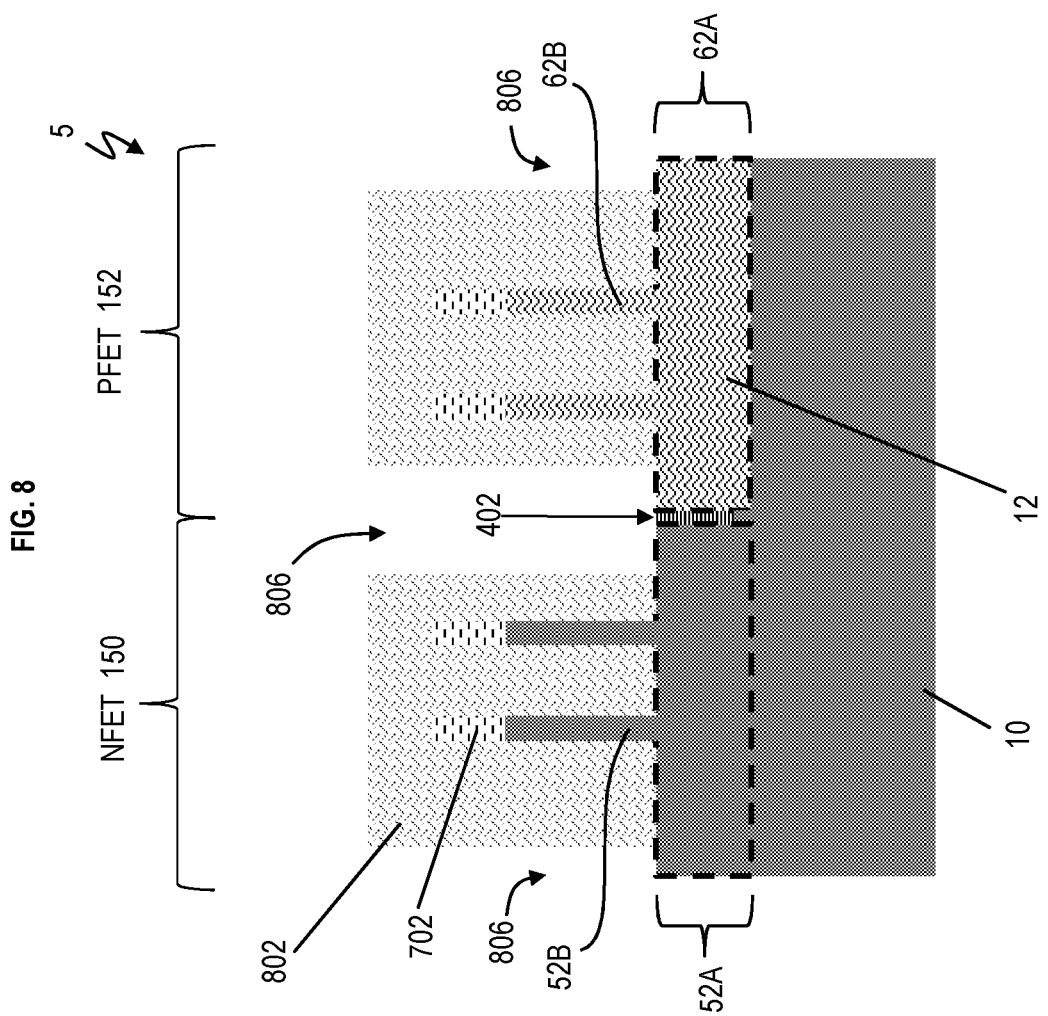
FIG. 8 is a cross-sectional view of the VFET structure depicting formation of a protecting layer according to one or more embodiments.

FIG. 8 is a cross-sectional view of the VFET structure 5 depicting formation of a protective layer according to one or more embodiments. In preparation for further etching, the protective layer 802 is formed over the fin mask layer 702, vertical fins 52B, vertical fins 62B, the source/drain 52A, and the source/drain 62A. As an example, the protective layer 802 can be an organic planarizing layer (OPL) that protects the covered parts. The protective layer 802 can be patterned to form voids 806 in the protective layer 802 such that open areas exposed on sides of the fins 52B and 62B. Accordingly, portions of the source/drain 52A, the source/drain 62A, and the side wall spacer 402 are exposed in the open areas 806 in preparation for etching. The protective layer 802 can be patterned using lithography.

Figure 9:
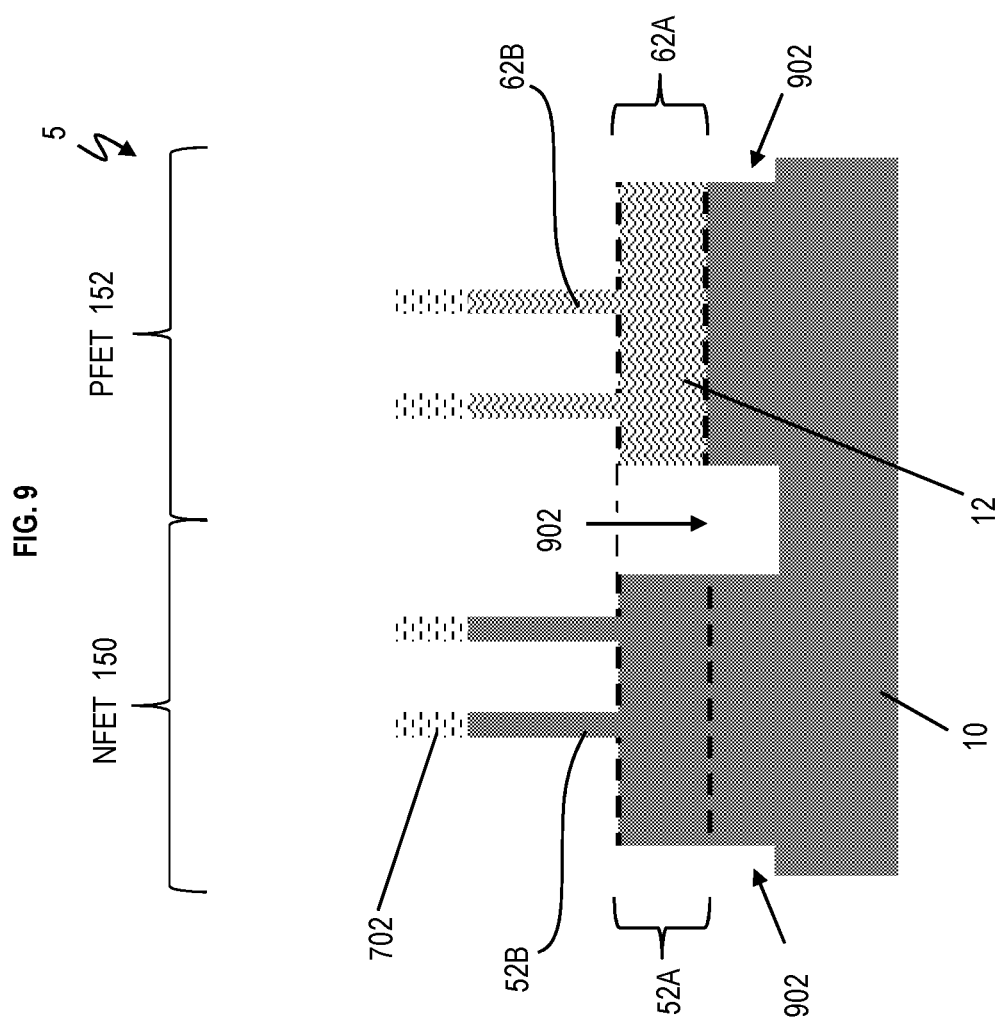
FIG. 9 is a cross-sectional view of the VFET structure depicting trench formation according to one or more embodiments.

FIG. 9 is a cross-sectional view of the VFET structure 5 depicting trench formation according to one or more embodiments. In FIG. 9, trenches 902 can be formed at the exposed portions 806 (in FIG. 8) of the source/drain 52A, the source/drain 62A, and the side wall spacer 402 discussed in FIG. 8. The trenches 902 remove the side wall spacer 402.

Figure 10:
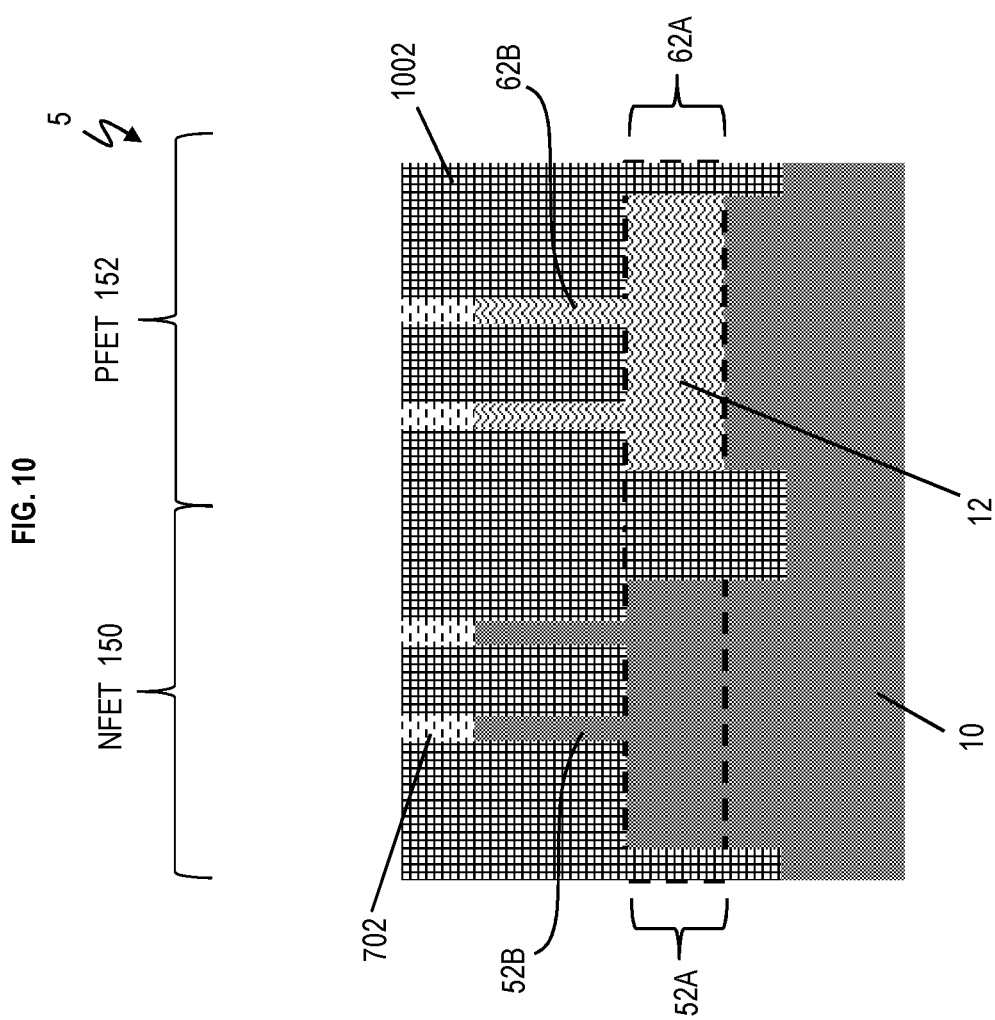
FIG. 10 is a cross-sectional view of the VFET structure depicting formation of a fill layer according to one or more embodiments.

FIG. 10 is a cross-sectional view of the VFET structure 5 depicting formation of a fill layer according to one or more embodiments. A fill layer 1002 is formed on top of the VFET structure 5 to fill in the trenches 902. The fill layer 1002 can be, for example, $SiO_2$. The fill layer 1002 can be planarized, for example CMP, down to the fin mask layer 702, such that the top surfaces of the fin mask layer 702 and the fill layer 1002 are coplanar.

Figure 11:
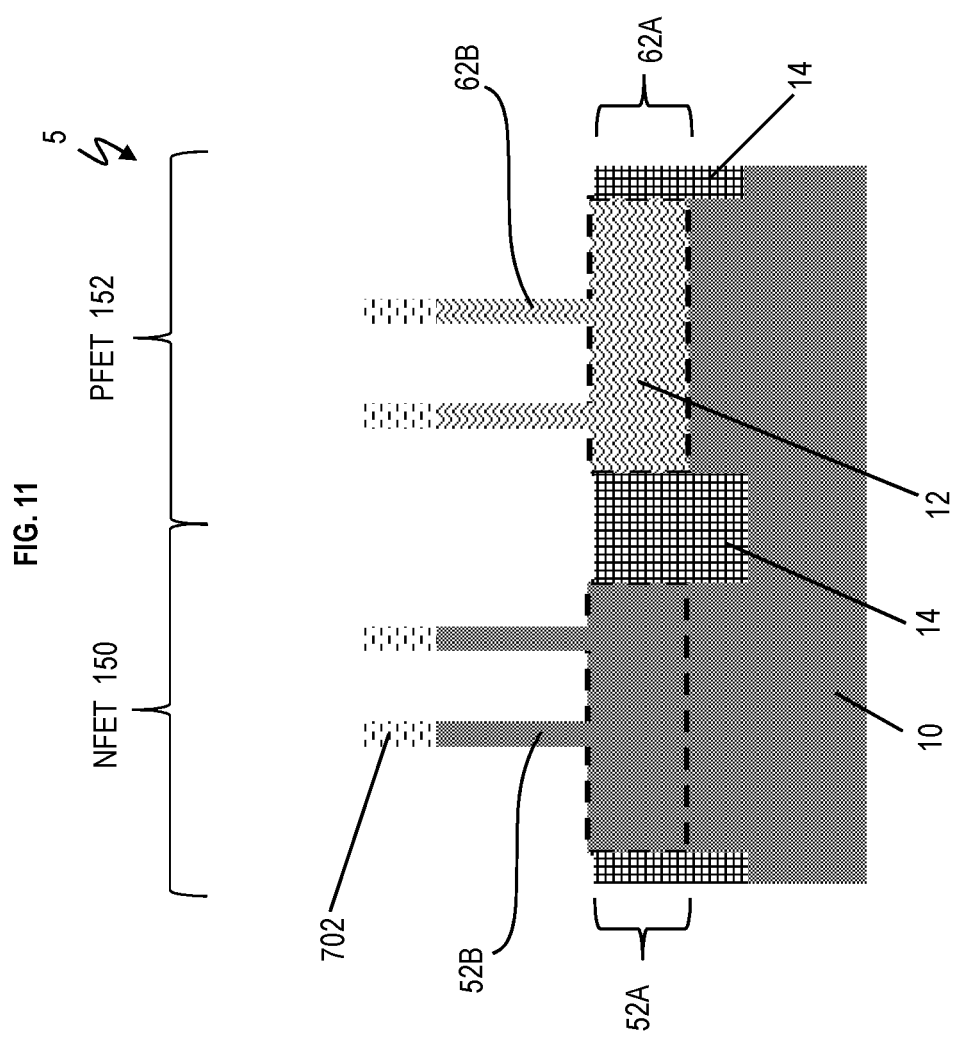
FIG. 11 is a cross-sectional view of the VFET structure depicting formation of the isolation regions according to one or more embodiments.

FIG. 11 is a cross-sectional view of the VFET structure 5 depicting formation of the isolation regions 14 according to one or more embodiments. The material of fill layer 1002 is etched back to form the isolation regions 14 in the trenches 902 (shown in FIG. 9). The fill layer 1002 is etched back to a height lower than the source/drain 52A and source/drain 62A in the y-axis. The isolation regions 14 can be $SiO_2$, and the $SiO_2$ material is a lower height in the isolations regions 14 in preparation to later form the gate. The fill layer 1002 can be etched back using a selective etch process.

Figure 12:
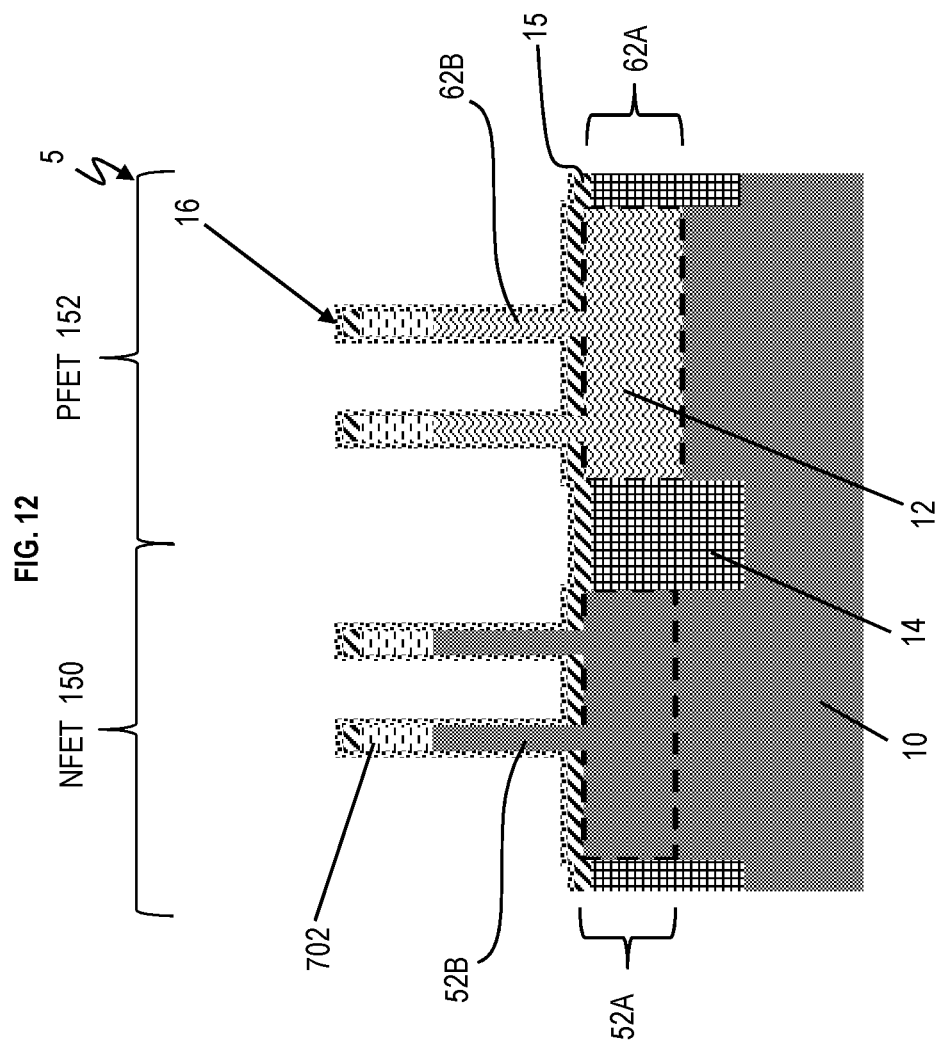
FIG. 12 is a cross-sectional view of the VFET structure depicting formation of the high-k dielectric material according to one or more embodiments.

FIG. 12 is a cross-sectional view of the VFET structure 5 depicting formation of the high-k dielectric material according to one or more embodiments. A bottom/first spacer 15 is formed on top of the source/drain 52A, the source/drain 62A, the isolation regions 14, and the fin mask layers 702. A direction deposition technique can be utilized to deposit the bottom/first spacer 15. The bottom/first spacer 15 can be a low-k dielectric material. The description of the bottom/first spacer 15 also applies to the top/second spacer 20.

A high-k dielectric material 16 is formed on top of the VFET structure 5. The high-k dielectric material 16 is formed to cover the bottom/first spacer 15 (along with the portions of the bottom/first spacer 15 on top of the fin mask layers 702), the vertical fins 52B, the vertical fins 62B, and the fin mask layers 702.

The high-k dielectric material 16 can be a dielectric material having a dielectric constant greater than 3.9, 7.0, or 10.0. Non-limiting examples of suitable materials for the high-k dielectric material 16 can include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The high-k dielectric material can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used.

Additionally, the bottom/first spacer 15 (and/or the top/second spacer 20) can be composed of, for example, an oxide, nitride or oxynitride material layer. When the bottom/first spacer 15 is an oxide, the bottom/first spacer 15 can be composed of silicon oxide ($SiO_2$). As used herein, the term "low-k" denotes a dielectric constant less than 3.9. In some embodiments, the low-k dielectric material of the bottom/first spacer 15 has a dielectric constant ranging from 1.0 to 3.0. In some embodiments, the bottom/first spacer 15 includes SiCOH or an aromatic hydrocarbon polymer composition, such as SILK™. In other embodiments, the bottom/first spacer 15 can include carbon-doped oxides. In other embodiments, the bottom/first spacer 15 can include an undoped silica glass. In other embodiments, the bottom/first spacer 15 can include be composed of diamond-like carbon (DLC).

The deposition process for forming the bottom/first spacer 15 (and/or the top/second spacer 20) can include chemical vapor deposition (CVD), plasma enhanced chemical vapor deposition (PECVD), physical vapor deposition (PVD), high-density plasma CVD or spin-on glass process.

Figure 13:
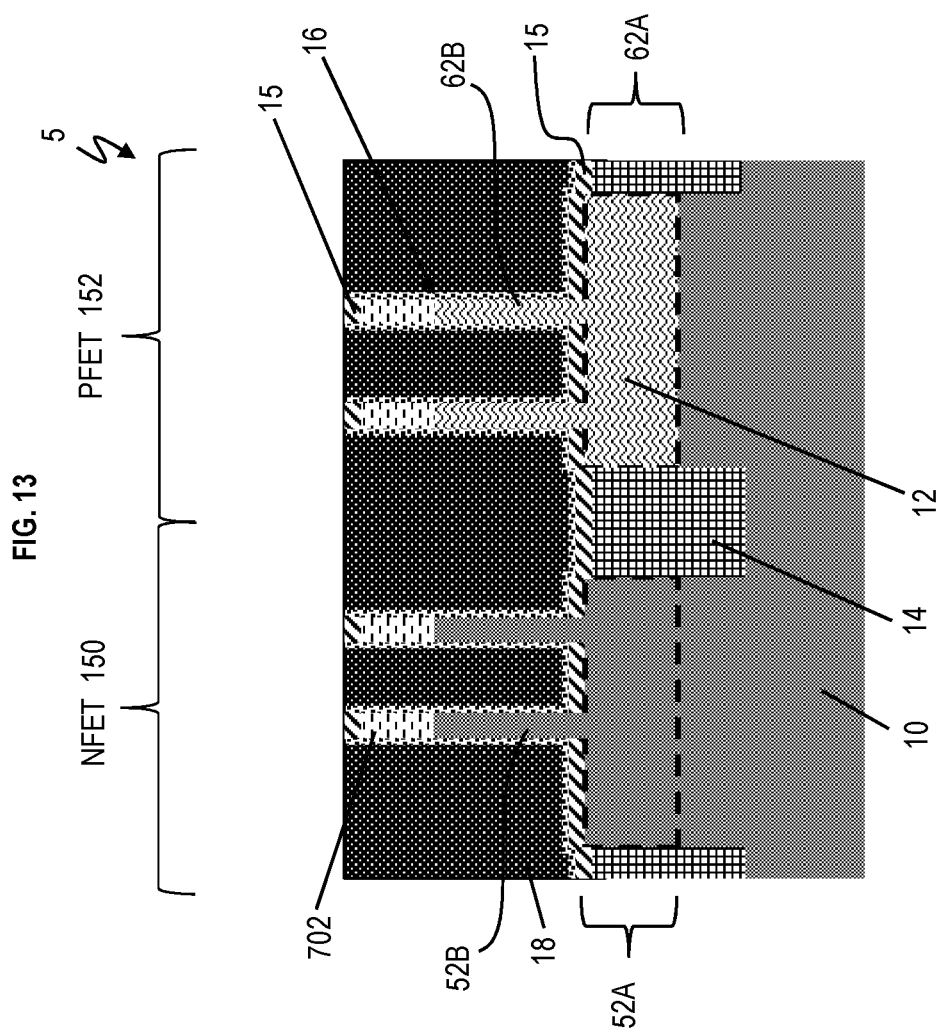
FIG. 13 is a cross-sectional view of the VFET structure depicting formation of a gate material according to one or more embodiments.

FIG. 13 is a cross-sectional view of the VFET structure 5 depicting formation of a gate material according to one or more embodiments. The gate material fills voids around the fins 52B and the fins 62B, and the gate material is utilized to form a gate metal 18 in FIG. 14. The gate material is planarized to make the top of the fins 52B and fins 62B, particularly the bottom/first spacer 15 on top of fins 52B and 62B, coplanar with the gate material 18.

Figure 14:
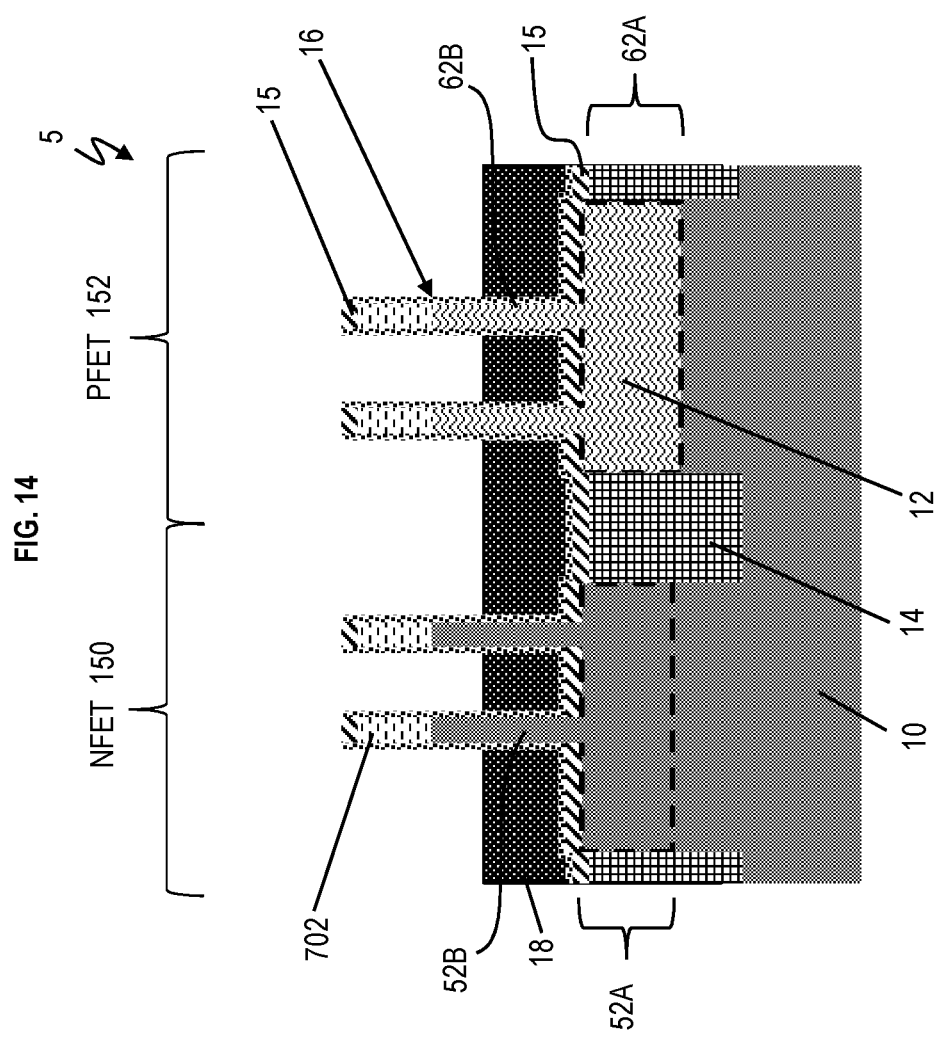
FIG. 14 is a cross-sectional view of the VFET structure depicting etching of the gate material according to one or more embodiments.

FIG. 14 is a cross-sectional view of the VFET structure 5 depicting etching of the gate material according to one or more embodiments. A gate metal recess etch is performed to recess the gate material to the desired height for the gate metal 18. The gate material of the gate metal 18 includes one or more work function metals. The type of work function metal(s) can depend on the type of transistor and can differ between the NFET and PFET devices. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

Figure 15:
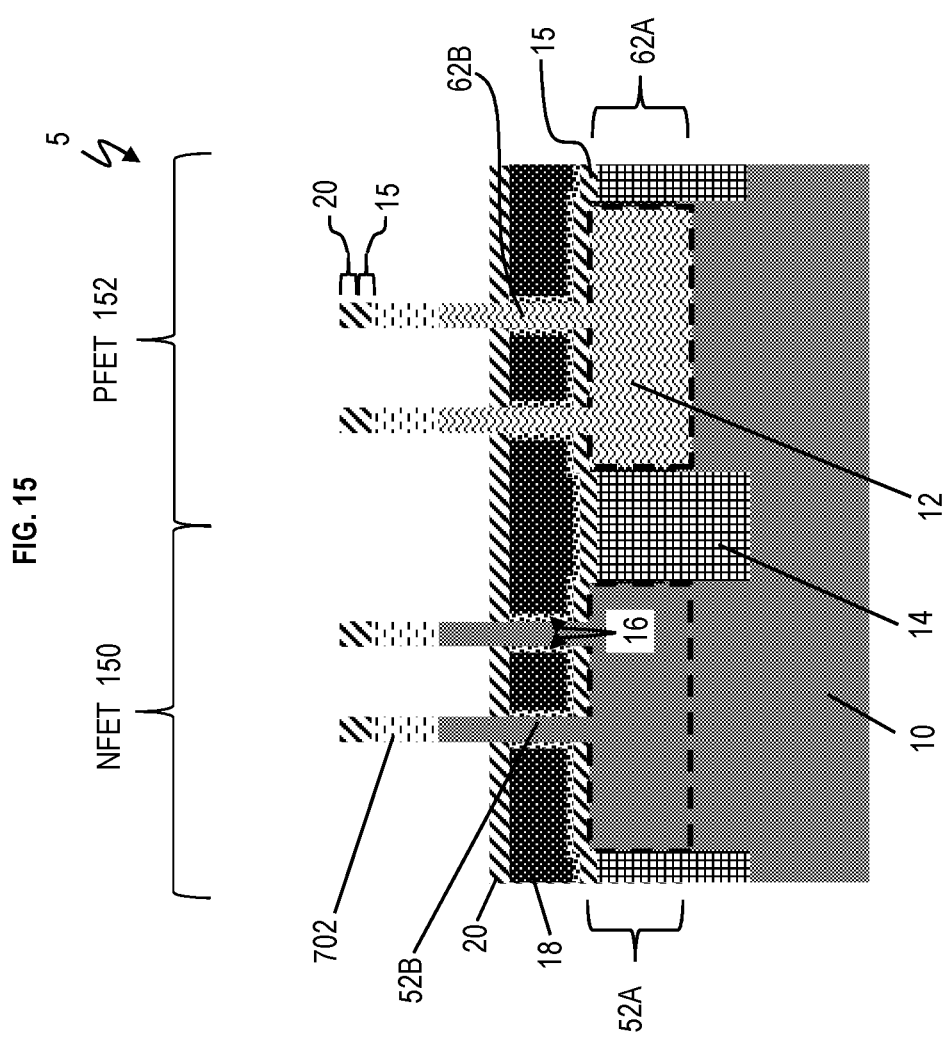
FIG. 15 is a cross-sectional view of the VFET structure depicting top/second spacer formation according to one or more embodiments.

FIG. 15 is a cross-sectional view of the VFET structure 5 depicting top/second spacer formation according to one or more embodiments. The top/second spacer 20 is formed on top of the gate metal 18, the high-k material 16, and the bottom/first spacer 15 that is on the fin mask layers 702. A direction deposition technique can be utilized to deposit the top/second spacer 20. The top/second spacer 20 can be a low-k dielectric material, and reference can be made to the bottom/first spacer 15 for the description of the top/second spacer 20. The gate metal 18 and the high-k dielectric material 16 are referred to as a gate stack.

Figure 16:
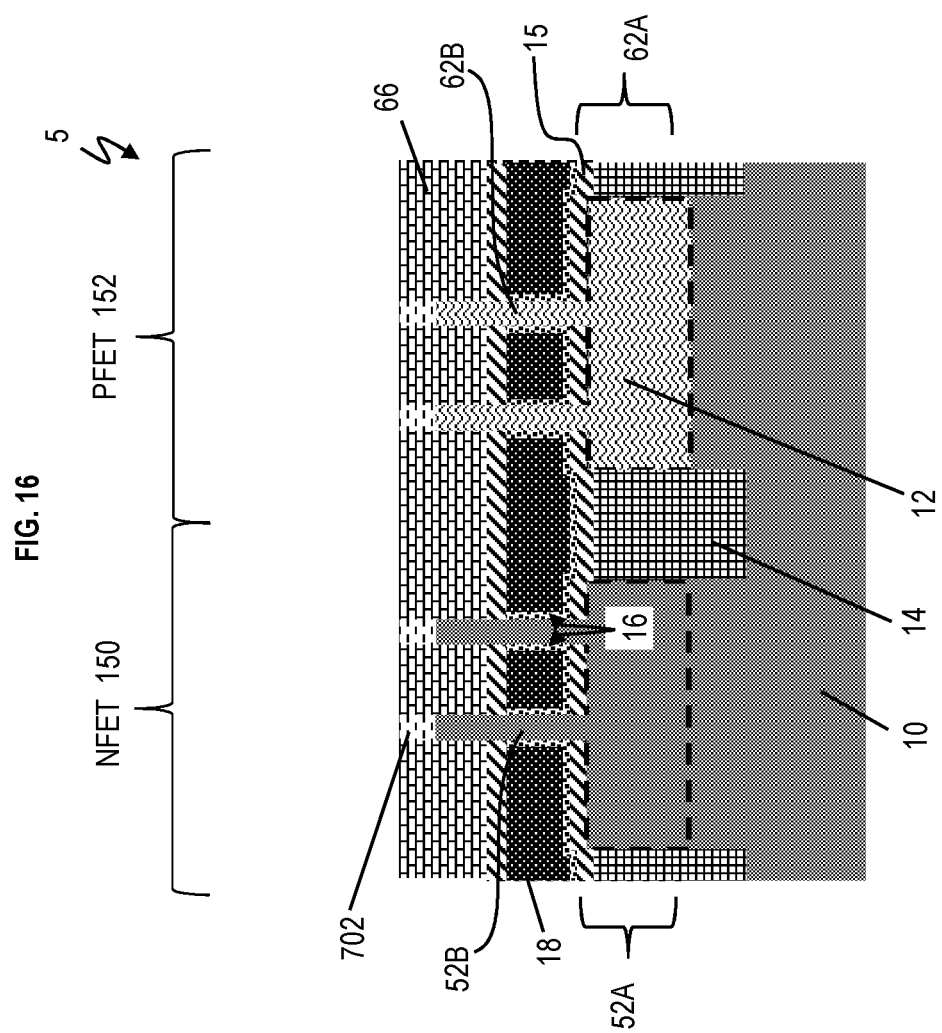
FIG. 16 is a cross-sectional view of the VFET structure depicting formation of the inter-level dielectric layer according to one or more embodiments.

FIG. 16 is a cross-sectional view of the VFET structure 5 depicting formation of the inter-level dielectric (ILD) layer 66 according to one or more embodiments. The ILD 66 is deposited on top of the VFET structure 5 and is planarized (e.g., CMP) down to the fin mask layer 702, such that the top surface of ILD 66 is coplanar with the top surface of the fin mask layer 702. In some embodiments, the ILD 66 can be $SiO_2$.

Figure 17:
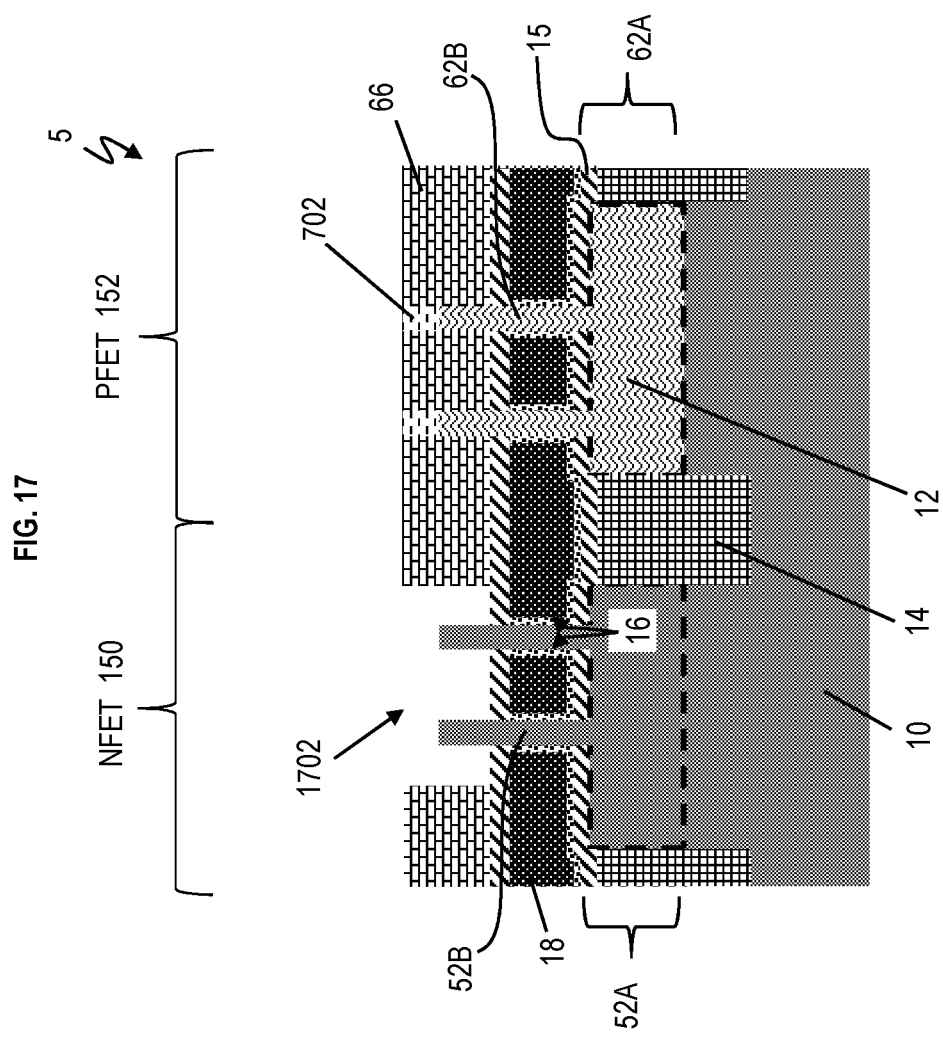
FIG. 17 is a cross-sectional view of the VFET structure depicting exposure of fins according to one or more embodiments.

FIG. 17 is a cross-sectional view of the VFET structure 5 depicting exposure of vertical fins 52B in the ILD 66 according to one or more embodiments. Lithography is utilized to etch an opening 1702 in the ILD 66 to expose the vertical fins 52B of the NFET device 150 and remove the fin mask layer 702 on the fins 52B. The PFET side is blocked, for example, using a mask (not shown) when etching the opening 1702.

FIG. 18 is a cross-sectional view of the VFET structure 5 depicting formation of the top source/drain 52C according to one or more embodiments. The top source/drain 52C is epitaxially grown from the fins 52B of the NFET device 150. The top source/drain 52C is epitaxially grown with the same crystalline structure of both the fins 52B and substrate 10. The material of the source/drain 52C, vertical fins 52B, and source/drain 52A can be the same material. The material of the source/drain 52C, vertical fins 52B, and source/drain 52A can be the same as the substrate 10, with the addition of n-type dopants.

Analogous to FIG. 17, FIG. 19 is a cross-sectional view of the VFET structure 5 depicting exposure of vertical fins 62B in the ILD 66 according to one or more embodiments. Lithography is utilized to etch an opening 1902 in the ILD 66 to expose the fins 62B of the PFET device 152 and remove the fin mask layer 702 on the vertical fins 62B. The NFET side is blocked, for example, using a mask (not shown) when etching the opening 1902.

Analogous to FIG. 18, FIG. 20 is a cross-sectional view of the VFET structure 5 depicting formation of the top source/drain 62C according to one or more embodiments. The top source/drain 62C is epitaxially grown from the fins 62B of the PFET device 150. The top source/drain 62C is epitaxially grown with the same crystalline structure of both the fins 62B and substrate 12. The material of the source/drain 62C, vertical fins 62B, and source/drain 62A can be the same material. The material of the source/drain 62C, vertical fins 62B, and source/drain 62A can be the same as the substrate 10, with the addition of p-type dopants.

To illustrate completion of the device, FIG. 1 is a cross-sectional view of the final version of the VFET structure 5.

One skilled in the art understands that additional material of the ILD 66 is deposited over the epitaxially grown top source/drain 52C and the epitaxially grown top source/drain 62C. Also, contacts 70, 72, 74, 76, and 78 are formed in the ILD 66. For the NFET device 150, the source/drain contact 70 is on the bottom source/drain 52A and the source/drain contact 72 is on the top source/drain 52C. For the PFET device, the source/drain contact 76 is on the top source/drain 62C and the source/drain contact 78 is on the bottom/source drain 62A. The gate contact 74 is on the gate metal 18.

FIG. 21 is a flow chart 2100 of a method of forming a vertical device 5 according to one or more embodiments. Reference can be made to FIGS. 1-20. At block 2102, provided is a first substrate 10 adjacent to a second substrate 12, where the first substrate has a first surface orientation, where the second substrate 12 has a second surface orientation different from the first surface orientation.

At block 2104, an NFET device 150 is formed with the first substrate 10, where the NFET device 150 includes a first source (e.g., source/drain) 52A, a first drain (e.g., source/drain) 52C, and one or more first fins 52B, where the first source 52A and the first drain 52C have a vertical relationship with respect to the one or more first fins 52B.

At block 2106, a PFET device 152 is formed with the second substrate 12, where the PFET device 152 includes a second source 62A, a second drain 62C, and one or more second fins 62B, where the second source 62A and the second drain 62C have a vertical relationship with respect to the one or more second fins 62B.

The first source 52A, the first drain 52C, and the one or more first fins 52B have the first surface orientation as the first substrate 10. The second source 62A, the second drain 62C, and the one or more second fins 62B have the second surface orientation as the second substrate 12.

The first one or more fins 52B have a first channel transport direction and the second one or more fins 62B have a second channel transport direction, where the first channel transport direction is different from the second channel transport direction. The first channel transport direction is defined for mobility of electrons (as the majority carrier) and the second channel transport direction is defined for mobility of holes (as the majority carrier).

In the NFET device 150, the first channel transport direction is different from the first surface orientation. In the PFET device 152, the second channel transport direction is different from the second surface orientation. The first transport direction is <100> and the second transport direction is <110>. The first surface orientation is <001>. The second surface orientation is <1-10>.

It will be noted that various microelectronic device fabrication methods can be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Also, the terms "epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

Removal is any process that removes material from the wafer: examples include etch processes (either wet or dry), and chemical-mechanical planarization (CMP), etc. Also, as used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 100:1 or greater, e.g., 1000:1.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, the method comprising:
    providing a first silicon wafer bonded to a second silicon wafer, the first silicon wafer having a first surface orientation, the second silicon wafer having a second surface orientation different from the first surface orientation;
    forming an n-type field effect transistor (NFET) device with the first silicon wafer, the NFET device including a first source, a first drain, and one or more first fins, wherein the first source and the first drain have a vertical relationship with respect to the one or more first fins; and
    forming a p-type field effect transistor (PFET) device with the second silicon wafer, the PFET device including a second source, a second drain, and one or more second fins, wherein the second source and the second drain have a vertical relationship with respect to the one or more second fins.

2. The method of claim 1, wherein the first source, the first drain, and the one or more first fins have the first surface orientation as the first silicon wafer.

3. The method of claim 1, wherein the second source, the second drain, and the one or more second fins have the second surface orientation as the second silicon wafer.

4. The method of claim 1, wherein the first one or more fins have a first channel transport direction and the second one or more fins have a second channel transport direction, the first channel transport direction being different from the second channel transport direction.

5. The method of claim 4, wherein the first channel transport direction is defined to be suited for mobility of electrons and the second channel transport direction is defined to be suited for mobility of holes.

6. The method of claim 4, wherein the first channel transport direction is different from the first surface orientation.

7. The method of claim 4, wherein the second channel transport direction is different from the second surface orientation.

8. The method of claim 4, wherein the first channel transport direction is <100> and the second channel transport direction is <110>.

9. The method of claim 1, wherein the first surface orientation is <001>.

10. The method of claim 1, wherein the second surface orientation is <1-10>.

11. A semiconductor device comprising:
    a first silicon wafer bonded to a second silicon wafer, the first silicon wafer having a first surface orientation, the second silicon wafer having a second surface orientation different from the first surface orientation;
    an n-type field effect transistor (NFET) device formed with the first silicon wafer, the NFET device including a first source, a first drain, and one or more first fins, wherein the first source and the first drain have a vertical relationship with respect to the one or more first fins; and
    a p-type field effect transistor (PFET) device formed with the second silicon wafer, the PFET device including a second source, a second drain, and one or more second fins, wherein the second source and the second drain have a vertical relationship with respect to the one or more second fins.

12. The semiconductor device of claim 11, wherein the first source, the first drain, and the one or more first fins have the first surface orientation as the first silicon wafer.

13. The semiconductor device of claim 11, wherein the second source, the second drain, and the one or more second fins have the second surface orientation as the second silicon wafer.

14. The semiconductor device of claim 11, wherein the first one or more fins have a first channel transport direction and the second one or more fins have a second channel transport direction, the first channel transport direction being different from the second channel transport direction.

15. The semiconductor device of claim 14, wherein the first channel transport direction is defined to be suited for mobility of electrons and the second channel transport direction is defined to be suited for mobility of holes.

16. The semiconductor device of claim 14, wherein the first channel transport direction is different from the first surface orientation.

17. The semiconductor device of claim 14, wherein the second channel transport direction is different from the second surface orientation.

18. The semiconductor device of claim 14, wherein the first channel transport direction is <100> and the second channel transport direction is <110>.

19. The semiconductor device of claim 11, wherein the first surface orientation is <001> and the second surface orientation is <1-10>.

* * * * *